(12) United States Patent
Tu et al.

(10) Patent No.: US 6,501,120 B1
(45) Date of Patent: Dec. 31, 2002

(54) CAPACITOR UNDER BITLINE (CUB) MEMORY CELL STRUCTURE EMPLOYING AIR GAP VOID ISOLATION

(75) Inventors: Yeur-Luen Tu, Hsin-Chu (TW); Chia-Shiung Tsai, Hsin-Chu (TW); Min-Hwa Chi, Hsin-Chu (TW)

(73) Assignee: Taiwan Semiconductor Manufacturing Company, Ltd, Hsin Chu (TW)

( * ) Notice: Subject to any disclaimer, the term of this patent is extended or adjusted under 35 U.S.C. 154(b) by 0 days.

(21) Appl. No.: 10/053,151

(22) Filed: Jan. 15, 2002

(51) Int. Cl.[7] .......................................... H01L 21/8242
(52) U.S. Cl. ..................... 257/306; 257/309; 438/253; 438/255
(58) Field of Search ................................ 257/306–311; 438/238, 3, 240–241, 253–256, 381, 396–399

(56) References Cited

U.S. PATENT DOCUMENTS

| | | | | |
|---|---|---|---|---|
| 5,416,736 A | * | 5/1995 | Kosa et al. | 257/380 |
| 6,069,038 A | * | 5/2000 | Hashimoto et al. | 438/235 |
| 6,174,767 B1 | | 1/2001 | Chi | |

* cited by examiner

*Primary Examiner*—Jey Tsai
(74) *Attorney, Agent, or Firm*—Tung & Associates

(57) ABSTRACT

Within both: (1) a method for forming a memory cell structure within a semiconductor integrated circuit microelectronic fabrication; and (2) the memory cell structure resulting from the method, there is provided a capacitor structure whose sidewall is separated from a bitline stud layer which is adjacent thereto and extends there above, by an air gap void. The air gap void provides for attenuated bitline to capacitor structure capacitive coupling, and thus enhanced performance of the memory cell structure.

13 Claims, 2 Drawing Sheets

CAPACITOR UNDER BITLINE (CUB) MEMORY CELL STRUCTURE EMPLOYING AIR GAP VOID ISOLATION

BACKGROUND OF THE INVENTION

1. Field of the Invention

The present invention relates generally to memory cell structures employed within semiconductor integrated circuit fabrications. More particularly, the present invention relates to capacitor under bitline (CUB) memory cell structures employed within semiconductor integrated circuit fabrications.

2. Description of the Related Art

Semiconductor integrated circuit fabrications are formed from semiconductor substrates within and upon which are formed semiconductor devices, and over which are formed patterned conductor layers which are separated by dielectric layers.

Common in the art of semiconductor integrated circuit fabrication, and in particular in the art of semiconductor memory fabrication, is the use and the fabrication of memory cell structures, and in particular dynamic random access memory (DRAM) cell structures. Dynamic random access memory (DRAM) cell structures typically comprises a field effect transistor (FET) device formed within and upon a semiconductor substrate, where one of a pair of source/drain regions within the field effect transistor (FET) device has formed thereover and in electrical communication therewith a storage capacitor. Within a dynamic random access memory (DRAM) cell structure, a gate electrode of the field effect transistor (FET) device serves as a wordline which provides a switching function for charge introduction and retrieval from the storage capacitor, while the other of the pair of source/drain regions within the field effect transistor (FET) device serves as a contact for a bitline conductor stud which introduces or retrieves charge with respect from the storage capacitor.

While the dynamic random access memory (DRAM) cell structure has clearly become ubiquitous in the art of semiconductor memory fabrication, and is thus essential in the art of semiconductor integrated circuit fabrication, the dynamic random access memory (DRAM) cell structure is nonetheless not entirely without problems in the art of semiconductor memory fabrication.

In that regard, as semiconductor integration levels have increased and semiconductor device and patterned conductor layer dimensions have decreased, it has become increasingly difficult in the art of semiconductor integrated circuit fabrication, and in particular in the art of semiconductor memory fabrication, to fabricate semiconductor integrated circuit fabrications with optimal and enhanced performance. Similarly, a common impediment to optimal and enhanced performance within advanced semiconductor integrated circuit fabrications is parasitic capacitive coupling losses between various structures within semiconductor integrated circuit fabrications.

It is thus desirable in the art of semiconductor integrated circuit fabrication, and in particular in the art of semiconductor memory fabrication, to provide methods and materials through which there may be formed, with enhanced performance, semiconductor integrated circuit fabrications.

It is towards the foregoing object that the present invention is directed.

Various methods have been disclosed in the art of semiconductor integrated circuit microelectronic fabrication for forming, with desirable properties, semiconductor integrated circuit fabrications.

Included among the methods, but not limited among the methods, are methods disclosed within Chi, in U.S. Pat. No. 6,174,767 (a method for forming a capacitor and bitline structure within a dynamic random access memory (DRAM) cell structure for use within a semiconductor memory fabrication, with attenuated bitline to bitline capacitance within the capacitor and bitline structure, by forming a pair of bitline structures within the capacitor and bitline structure at an equivalent topographic level with a capacitor within the capacitor and bitline structure).

Desirable in the art of semiconductor integrated circuit fabrication, and in particular in the art of semiconductor memory fabrication, are additional methods and materials which may be employed for forming, with enhanced performance, semiconductor integrated circuit fabrications.

It is towards the foregoing object that the present invention is directed.

SUMMARY OF THE INVENTION

A first object of the invention is to provide a semiconductor integrated circuit fabrication and a method for fabricating the semiconductor integrated circuit fabrication.

A second object of the present invention is to provide a semiconductor integrated circuit fabrication and a method for fabricating the semiconductor integrated circuit fabrication in accord with the first object of the present invention, wherein the semiconductor integrated circuit fabrication is formed with enhanced performance.

A third object of the present invention is to provide a semiconductor integrated circuit fabrication and a method for fabricating the semiconductor integrated circuit fabrication in accord with the first object of the present invention and the second object of the present invention, wherein the method is readily commercially implemented.

In accord with the objects of the present invention, there is provided by the present invention: (1) a method for fabricating a memory cell structure; and (2) a memory cell structure which results from the method for fabricating the memory cell structure.

To practice the method of the present invention, there is first provided a semiconductor substrate. There is then formed within and upon the semiconductor substrate a field effect transistor (FET) device comprising a gate dielectric layer formed upon the semiconductor substrate, a gate electrode formed upon the gate dielectric layer and a pair of source/drain regions formed into the semiconductor substrate and separated by the gate electrode. There is then formed over the field effect transistor (FET) device and in electrical communication with one of the pair of source/drain regions within the field effect transistor (FET) device a capacitor structure having a sidewall. Finally, there is then formed over the field effect transistor (FET) device and in electrical communication with the other of the pair of source/drain regions within the field effect transistor (FET) device a bitline stud layer adjacent to and extending above the sidewall of the capacitor structure. Within the present invention, the bitline stud layer is separated from the sidewall of the capacitor structure at least in part by an air gap void.

The method for fabricating the memory cell structure in accord with the present invention contemplates a memory cell structure fabricated in accord with the method for fabricating the memory cell structure in accord with the present invention.

The present invention provides a semiconductor integrated circuit fabrication and a method for fabricating the semiconductor integrated circuit fabrication, wherein the semiconductor integrated circuit fabrication is formed with enhanced performance.

The present invention realizes the foregoing object by employing when forming a memory cell structure for use within a semiconductor integrated circuit fabrication an air gap void interposed, at least in part, between: (1) a sidewall of a capacitor structure in electrical communication with one of a pair of source/drain regions within a field effect transistor (FET) device within the memory cell structure; and (2) a bitline stud layer in electrical communication with the other of the pair of source/drain regions within the field effect transistor (FET) device, where the bitline stud layer is adjacent to and extends above the sidewall of the capacitor structure. Within the present invention, the air gap void provides for attenuated parasitic capacitance between the capacitor structure and the bitline stud layer.

The method of the present invention is readily commercially implemented.

The present invention employs methods and materials as are generally known in the art of semiconductor integrated circuit fabrication, but employed within the context of a specific process ordering and specific materials limitations to provide a memory cell structure in accord with the present invention. Since it is thus at least in part a specific process ordering and specific materials limitations which provide at least in part the present invention, rather than the existence of methods and materials which provides the present invention, the method of the present invention is readily commercially implemented.

BRIEF DESCRIPTION OF THE DRAWINGS

The objects, features and advantages of the present invention are understood within the context of the Description of the Preferred Embodiment, as set forth below. The Description of the Preferred Embodiment is understood within the context of the accompanying drawings, which form a material part of this disclosure, wherein.

DESCRIPTION OF THE PREFERRED EMBODIMENT

The present invention provides a semiconductor integrated circuit fabrication and a method for fabricating the semiconductor integrated circuit fabrication, wherein the semiconductor integrated circuit fabrication is formed with enhanced performance.

The present invention realizes the foregoing object by employing when forming a memory cell structure for use within a semiconductor integrated circuit fabrication an air gap void interposed, at least in part, between: (1) a sidewall of a capacitor structure in electrical communication with one of a pair of source/drain regions within a field effect transistor (FET) device within the memory cell structure; and (2) a bitline stud layer in electrical communication with the other of the pair of source/drain regions within the field effect transistor (FET) device, where the bitline stud layer is adjacent to and extends above the sidewall of the capacitor structure. Within the present invention, the air gap void provides for attenuated parasitic capacitance between the capacitor structure and the bitline stud layer.

Although the preferred embodiment of the present invention illustrates the invention most particularly within the context of a capacitor under bitline (CUB) dynamic random access memory (DRAM) cell structure, the present invention may nonetheless be employed within memory cell structures other than dynamic random access memory (DRAM) cell structures. In that regard, and in general, the present invention may be employed within memory cell structures which normally have a bitline stud layer adjacent to, and extending above, a sidewall of a capacitor structure.

Referring now to FIG. 1 to FIG. 4, there is shown a series of schematic cross-sectional diagrams illustrating the results of progressive stages in forming, in accord with a preferred embodiment of the present invention, a dynamic random access memory (DRAM) cell structure within a semiconductor integrated circuit fabrication.

Figure 1:
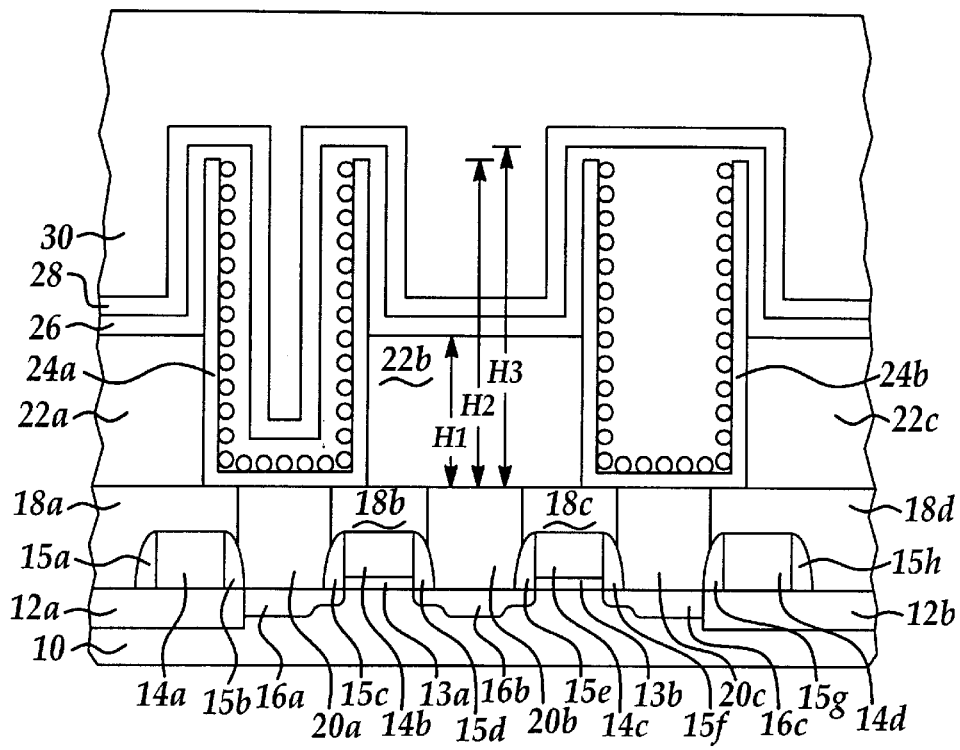
FIG. 1, FIG. 2, FIG. 3 and FIG. 4 show a series of schematic cross-sectional diagrams illustrating the results of progressive stages in forming, in accord with a preferred embodiment of the present invention, a dynamic random access memory (DRAM) cell structure within a semiconductor integrated circuit fabrication.

Shown in FIG. 1 is a schematic cross-sectional diagram of the semiconductor integrated circuit fabrication at an early stage in its fabrication in accord with the preferred embodiment of the present invention.

Shown within FIG. 1, in a first instance, is a semiconductor substrate 10 having formed therein a pair of isolation regions 12a and 12b.

Within the preferred embodiment of the present invention with respect to the semiconductor substrate 10, and although semiconductor substrates are known in the art of semiconductor integrated circuit fabrication with either dopant polarity, several dopant concentrations and various crystallographic orientations, for the preferred embodiment of the present invention, the semiconductor substrate 10 is typically and preferably a (100) silicon semiconductor substrate having at least either N- and P-doped regions.

Similarly, within the preferred embodiment of the present invention with respect to the pair of isolation regions 12a and 12b, and although it is also known in the art of semiconductor integrated circuit fabrication that isolation regions may be formed employing methods including but not limited to thermal growth methods and deposition/patterning region methods, for the preferred embodiment of the present invention, the isolation regions 12a and 12b are, as is illustrated within the schematic cross-sectional diagram of FIG. 1, formed as shallow trench isolation (STI) regions formed at least in part of a silicon oxide material formed within the semiconductor substrate 10.

Shown also within the schematic cross-sectional diagram of FIG. 1, and formed upon the active region of the semiconductor substrate defined by the pair of isolation regions 12a and 12b, is a pair of field effect transistor (FET) devices comprising: (1) a pair of gate dielectric layers 13a and 13b formed upon the active region of the semiconductor substrate 10; (2) a pair of gate electrodes 14b and 14c aligned upon the pair of gate dielectric layers 13a and 13b; (3) a series of spacer layers 15c, 15d, 15e and 15f formed adjoining a pair of opposite edges of the pair of gate dielectric layers 13a and 13b and the pair of gate electrodes 14b and 14c; and (4) a series of source/drain regions 16a, 16b and 16c formed within the active region of the semiconductor substrate and separated by the pair of gate electrodes 14b and 14c. Similarly, there is also shown within the schematic cross-sectional diagram of FIG. 1 a pair of interconnect structures which comprises: (1) a pair of interconnect layers 14a and 14d formed upon the corresponding isolation regions 12a and 12b; and (2) a series of spacer layers 15a, 15b, 15g and 15h formed adjacent a series of sidewalls of the pair of interconnect layers 14a and 14b.

Within the preferred embodiment of the present invention, each of the foregoing series of structures which comprises the pair of field effect transistor (FET) devices and the pair of interconnect structures may be formed employing methods and materials as are conventional in the art of semiconductor integrated circuit fabrication.

For example, and without limitation, the pair of gate dielectric layers 13a and 13b is typically and preferably, although not exclusively, formed of a silicon oxide gate dielectric material thermally grown upon the active region of the semiconductor to a thickness of from about 30 to about 100 angstroms. In addition, and also for example, and also without limitation, the pair of gate electrodes 14b and 14c, as well as the pair of interconnect layers 14a and 14d, is typically and preferably, but not exclusively, formed of a gate electrode material such as but not limited to a metal, metal alloy, doped polysilicon (having a dopant concentration of greater than about 5E19 dopant atoms per cubic centimeter) or polycide (doped polysilicon/metal silicide stack) gate electrode material, formed to a thickness of from about 1000 to about 3000 angstroms (although doped polysilicon and polycide gate electrode materials are typically preferred). Further, and also for example, and also without limitation, the series of spacer layers 15a, 15b, 15c, 15d, 15e, 15f, 15g and 15h is typically and preferably formed of a dielectric spacer material, such as but not limited to a silicon nitride dielectric spacer material or a silicon oxide dielectric spacer material, formed in a spacer shape while employing an anisotropic etching method. Finally, and also for example, and also without limitation, the series of source/drain regions 16a, 16b and 16c is typically and preferably formed employing an ion implantation method which employs the pair of gate electrodes 14b and 14c as a mask. Typically and preferably, the ion implantation method employs an ion implantation dosage of from about 1E13 to about 5E13 dopant atoms per square centimeter and an ion implantation energy of from about 20 to about 30 kev.

Shown also within the schematic cross-sectional diagram of FIG. 1, and formed passivating the pair of field effect transistor (FET) devices and the pair of interconnect structures, is a series of patterned planarized pre-metal dielectric (PMD) layers 18a, 18b, 18c and 18d which defines a series of three first apertures within which is formed a series of three conductive landing studs 20a, 20b and 20c.

Within the preferred embodiment of the present invention with respect to the series of patterned planarized pre-metal dielectric layers 18a, 18b, 18c and 18d, the series of patterned planarized pre-metal dielectric layers 18a, 18b, 18c and 18d is typically and preferably formed of a silicon oxide dielectric material layer (preferably undoped) deposited employing an ozone assisted thermal chemical vapor deposition (CVD) method or a high density plasma chemical vapor deposition (HDP-CVD) method, and planarized to a thickness of from about 4000 to about 7000 angstroms while passivating the pair of field effect transistor (FET) devices and the pair of interconnect structures. The planarized silicon oxide dielectric material layer is then patterned to form the series of three first apertures which access the series of source/drain regions 16a, 16b and 16c.

Similarly, once having formed the series of patterned planarized pre-metal dielectric (PMD) layers 18a, 18b, 18c and 18d, the series of conductive landing studs 20a, 20b and 20c is typically and preferably formed within the series of three first apertures defined by the series of patterned planarized pre-metal dielectric (PMD) layers 18a, 18b, 18c and 18d, while employing a blanket deposition and chemical mechanical polish (CMP) planarizing method. Although the series of conductive landing studs 20a, 20b and 20c may be formed from any of several conductor materials, including but not limited to metal, metal alloy, doped polysilicon and polycide conductor materials, for the preferred embodiment of the present invention, the series of conductive landing studs 20a, 20b and 20c is typically and preferably formed of a doped polysilicon conductor material.

Shown also within the schematic cross-sectional diagram of FIG. 1, and formed upon the series of patterned planarized pre-metal dielectric (PMD) layers 18a, 18b, 18c and 18d, is a series of etched back first capacitor node dielectric layers 22a, 22b and 22c which defines a pair of second apertures which leave exposed upper portions of the pair of conductive landing studs 20a and 20c. Similarly, there is also shown within the schematic cross-sectional diagram of FIG. 1, and formed conformally within and extending above the pair of second apertures defined by the series of etched back first capacitor node dielectric layers 22a, 22b and 22c, a pair of patterned conformal first capacitor plate layers 24a and 24b.

Within the preferred embodiment of the present invention with respect to the series of etched back first capacitor node dielectric layers 22a, 22b and 22c, the series of etched back first capacitor node dielectric layers 22a, 22b and 22c is typically formed of a dielectric material generally analogous to the dielectric material from which is formed the series of patterned planarized pre-metal dielectric (PMD) layers 18a, 18b, 18c and 18d. Typically and preferably, under circumstances where the series of patterned planarized pre-metal dielectric (PMD) layers 18a, 18b, 18c and 18d is formed of a silicon oxide dielectric material deposited employing an ozone assisted thermal chemical vapor deposition (CVD) method or a high density plasma chemical vapor deposition (HDP-CVD) method, the series of etched back first capacitor node dielectric layers 22a, 22b and 22c is formed of a dense silicon oxide dielectric material formed a plasma enhanced chemical vapor deposition (PECVD) method. Similarly, within the preferred embodiment of the present invention with respect to the pair of patterned conformal first capacitor plate layers 24a and 24b, and although other methods and materials may be employed in forming the pair of patterned conformal first capacitor plate layers 24a and 24b, the pair of patterned conformal first capacitor plate layers 24a and 24b is typically and preferably formed of a doped polysilicon material, typically and preferably also formed, as is illustrated within the schematic cross-sectional diagram of FIG. 1, with a hemispherical surface grain, in order to provide enhanced surface area of the pair of patterned conformal first capacitor plate layers 24a and 24b.

As is understood by a person skilled in the art, in order to form the series of etched back first capacitor node dielectric layers 22a, 22b and 22c as illustrated within the schematic cross-sectional diagram of FIG. 1, along with the pair of patterned conformal first capacitor plate layers 24a and 24b as illustrated within the schematic cross-sectional diagram of FIG. 1, there is first formed a blanket first capacitor node dielectric layer which is patterned to form a series of patterned first capacitor node dielectric layers which defines the pair of second apertures which exposes upper portions of the pair of conductive landing studs 20a and 20c. There is then formed conformally upon exposed surfaces of the series of patterned first capacitor node dielectric layers and contacting the pair of conductive landing studs 20a and 20c a blanket conformal first capacitor plate layer which is subsequently chemical mechanical polish (CMP) planarized to form the pair of patterned conformal first capacitor plate layers 24a and 24b. The series of patterned first capacitor node dielectric layers is then etched back to form the series of etched back first capacitor node dielectric layers 22a, 22b and 22c as illustrated within the schematic cross-sectional diagram of FIG. 1.

Typically and preferably, each of the series of etched back first capacitor node dielectric layers 22a, 22b and 22c is formed to a thickness H1 of from about 2000 to about 12000 angstroms. Typically and preferably, each of the pair of patterned conformal first capacitor plate layers 24a and 24b is formed to a thickness of from about 300 to about 600 angstroms, and a height H2 above the corresponding conductive landing stud 20a or 20c of from about 12000 to about 26000 angstroms.

Finally, there is also illustrated within the schematic cross-sectional diagram of FIG. 1, and formed upon exposed portions of the series of etched back first capacitor node dielectric layers 22a, 22b and 22c, and the pair of patterned conformal first capacitor plate layers 24a and 24b, a series of three blanket layers comprising: (1) a blanket second capacitor plate layer 26 formed upon exposed portions of the series of etched back first capacitor node dielectric layers 22a, 22b and 22c and the pair of blanket conformal first capacitor plate layers 24a and 24b, the blanket conformal second capacitor plate layer 26 having formed thereupon; (2) a blanket conformal sacrificial layer 28, in turn having formed thereupon; (3) a blanket gap filling second capacitor node dielectric layer 30. Also present within the semiconductor integrated circuit fabrication whose schematic cross-sectional diagram is illustrated in FIG. 1, but not specifically illustrated within the semiconductor integrated circuit fabrication whose schematic cross-sectional diagram is illustrated in FIG. 1, is a blanket capacitor dielectric layer which is first formed upon exposed portions of the series of etched back first capacitor node dielectric layers 22a, 22b and 22c, and the pair of patterned conformal first capacitor plate layers 24a and 24b, prior to forming thereupon and thereover the blanket conformal second capacitor plate layer 26.

Within the preferred embodiment of the present invention with respect to the blanket capacitor dielectric layer which is not otherwise illustrated within the schematic cross-sectional diagram of FIG. 1, the blanket capacitor dielectric layer is typically and preferably formed as a laminate of silicon oxide and silicon nitride dielectric materials, formed to a thickness of from about 30 to about 50 angstroms.

Within the preferred embodiment of the present invention with respect to the blanket conformal second capacitor plate layer 26, the blanket second capacitor plate layer 26 is typically and preferably formed employing materials analogous or equivalent to the materials as employed for forming the pair of patterned conformal first capacitor plate layers 24a and 24b.

Within the preferred embodiment of the present invention with respect to the blanket conformal sacrificial layer 28, and in accord with further disclosure below, the blanket conformal sacrificial layer 28 is formed of a material which has an enhanced etch rate within a selected isotropic etchant, in comparison with corresponding etch rates of the dielectric materials from which are formed: (1) the blanket gap filling second capacitor node dielectric layer 30; and (2) the etched back first capacitor node dielectric layers 22a, 22b and 22c. Within the context of the preferred embodiment of the present invention, the blanket sacrificial layer 28 is typically and preferably formed of a doped silicate glass dielectric material (such as but not limited to a boron, a phosphorus or a boron and phosphorus doped silicate glass dielectric material) formed to a thickness of from about 300 to about 1000 angstroms upon the blanket conformal second capacitor plate layer 26.

Finally within the preferred embodiment of the present invention with respect to the blanket gap filling second capacitor node dielectric layer 30, the blanket gap filling second capacitor node dielectric layer 30 may be formed employing a gap filling dielectric material analogous or equivalent to a dielectric material from which is formed the etched back first capacitor node dielectric layers 22a, 22b and 22c. The gap filling dielectric material may be planarized while employing a chemical mechanical polish (CMP) planarizing method. Typically and preferably, the blanket gap filling second capacitor node dielectric layer 30 is formed to a thickness of from about 5000 to about 15000 angstroms.

Figure 2:
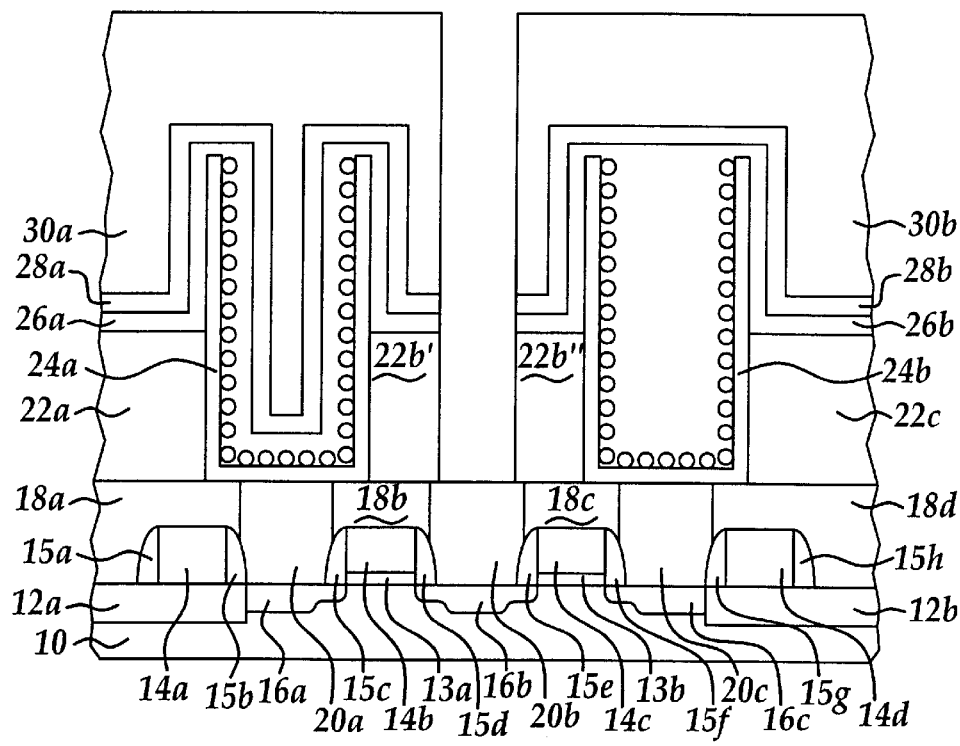

Referring now to FIG. 2, there is shown a schematic cross-sectional diagram illustrating the results of further processing of the semiconductor integrated circuit fabrication whose schematic cross-sectional diagram is illustrated in FIG. 1.

Shown in FIG. 2 is a schematic cross-sectional diagram of a semiconductor integrated circuit fabrication otherwise equivalent to the semiconductor integrated circuit fabrication whose schematic cross-sectional diagram is illustrated in FIG. 1, but wherein: (1) the blanket gap filling second capacitor node dielectric layer 30; (2) the blanket conformal sacrificial layer 28; (3) the blanket conformal second capacitor plate layer 26; (4) the blanket capacitor dielectric layer formed thereunder and not shown; and (5) the etched back first capacitor node dielectric layer 22b, have been patterned to form a corresponding series of: (1) patterned gap filling second capacitor node dielectric layers 30a and 30b; (2) patterned conformal sacrificial layers 28a and 28b; (3) patterned conformal second capacitor plate layers 26a and 26b; (4) patterned capacitor dielectric layers (not shown); and (5) patterned etched back first capacitor node dielectric layers 22b' and 22b'. Within the preferred embodiment of the present invention, the foregoing series of patterned layers defines a third aperture which reaches the conductive landing stud 20b.

The foregoing series of patterned layers may be formed while masking, as appropriate, the semiconductor integrated circuit fabrication whose schematic cross-sectional diagram is illustrated in FIG. 1, and then employing a sequential series of anisotropic etchants (typically and preferably anisotropic reactive ion etch (RIE) etchants), to form the foregoing series of patterned layers which defines the third aperture which reaches the conductive landing stud 20b.

Figure 3:
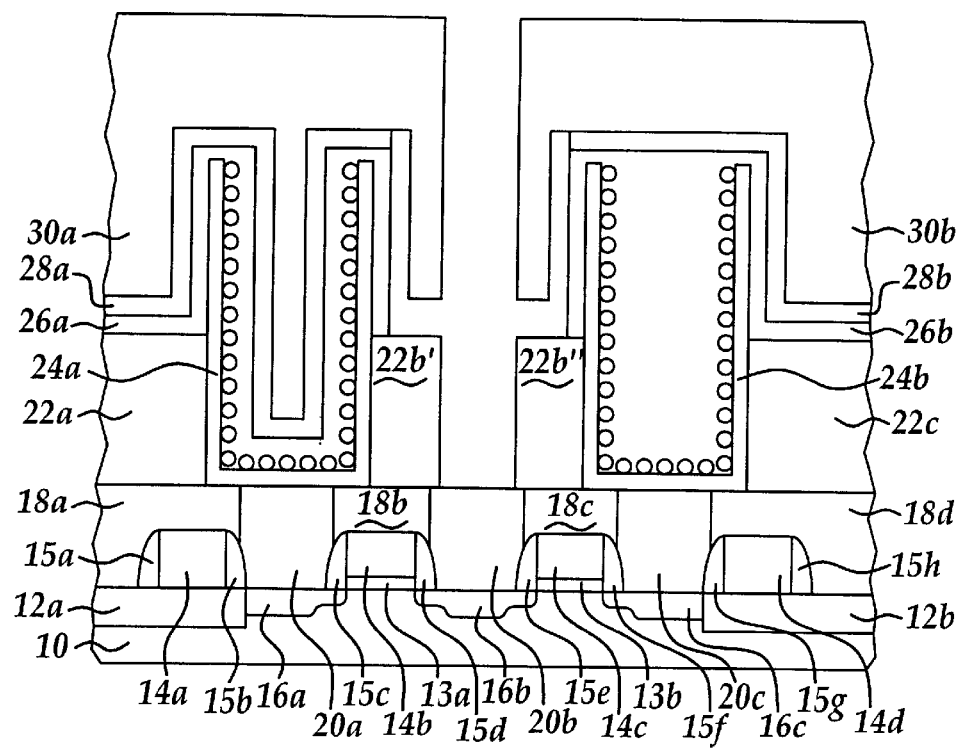

Referring now to FIG. 3, there is shown a schematic cross-sectional diagram illustrating the results of further processing of the semiconductor integrated circuit fabrication whose schematic cross-sectional diagram is illustrated in FIG. 2.

Shown in FIG. 3 is a schematic cross-sectional diagram of a semiconductor integrated circuit fabrication otherwise equivalent to the semiconductor integrated circuit fabrication whose schematic cross-sectional diagram is illustrated in FIG. 2, but wherein, in a first instance, portions of the pair of patterned conformal second capacitor plate layers 26a and 26b which are exposed within the sidewall of the third aperture are etched back to form a pair of etched back patterned conformal second capacitor plate layers 26a' and 26b'.

Within the preferred embodiment of the present invention, the pair of patterned conformal second capacitor plate layers 26a and 26b may be etched back to form the pair of etched back patterned conformal second capacitor plate layers 26a' and 26b' while employing an isotropic etchant as is conventional in the art of semiconductor integrated circuit microelectronic fabrication. Such isotropic etchants may include, but not limited to, higher pressure reactive ion etch (RIE) etchants, as well as aqueous etchant solutions comprising ammonia and hydrogen peroxide.

Similarly, there is also shown within the schematic cross-sectional diagram of FIG. 3 the results of etching back portions of the patterned conformal sacrificial layers 28a and 28b exposed within the sidewalls of the third aperture to form a pair of etched back patterned conformal sacrificial layers 28a' and 28b'.

Within the preferred embodiment of the present invention when: (1) the pair of patterned conformal sacrificial layers 28a and 28b is formed of a doped silicate glass dielectric material (i.e., having a total boron and phosphorus dopant concentration of at least about 6 weight percent); (2) the pair of patterned etched back first capacitor node dielectric layers 22b' and 22b' is formed of an undoped silicon oxide dielectric material; and (3) the pair of patterned gap filling second capacitor node dielectric layers 30a and 30b is also formed of an undoped silicon oxide dielectric material, the pair of patterned conformal sacrificial layers 28a and 28b may be selectively etched to form the pair of etched back patterned conformal sacrificial layers 28a' and 28b' while employing a vaporous hydrofluoric acid etchant. Under such circumstances the vaporous hydrofluoric acid etchant typically and preferably exhibits an etch selectivity of greater than about 100:1 with respect to the adjoining dielectric layers noted above.

Figure 4:
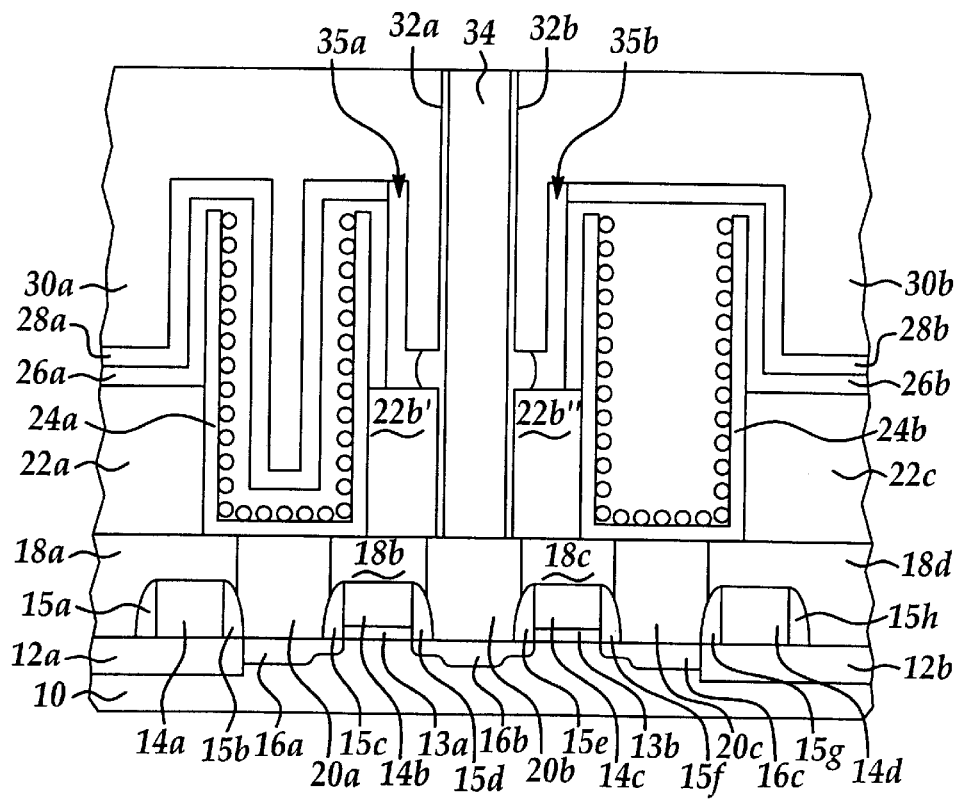

Referring now to FIG. 4, there is shown a schematic cross-sectional diagram illustrating the results of further processing of the semiconductor integrated circuit fabrication whose schematic cross-sectional diagram is illustrated in FIG. 3.

Shown in FIG. 4 is a schematic cross-sectional diagram of a semiconductor integrated circuit fabrication otherwise equivalent to the semiconductor integrated circuit fabrication whose schematic cross-sectional diagram is illustrated in FIG. 3, but wherein, in a first instance, there is formed within the third aperture a pair of contiguous liner and sidewall plug layers 32a and 32b. In addition to sealing the sidewalls of the third aperture, the pair of contiguous liner and sidewall plug layers 32a and 32b also isolate the openings in the sidewalls of the third aperture resulting from etchback of the pair of patterned conformal second capacitor plate layers 26a and 26b and the pair of patterned conformal sacrificial layers 28a and 28b (when forming therefrom the corresponding pair of etched back patterned conformal second capacitor plate layers 26a' and 26b' and the corresponding pair of etched back patterned conformal sacrificial layers 28a' and 28b').

Within the preferred embodiment of the present invention, the pair of contiguous liner and sidewall plug layers 32a and 32b may be formed employing blanket conformal layer deposition and etchback methods as are conventional in the art of semiconductor integrated circuit fabrication. Typically and preferably the pair of contiguous liner and sidewall plug layers 32a and 32b is formed of a silicon oxide dielectric material while employing a conventional anisotropic spacer type etch method.

As is illustrated within the schematic cross-sectional diagram of FIG. 4, the pair of contiguous liner and plug layers 32a and 32b once having been formed lining the third aperture seal the sidewalls of the third aperture such as to provide a pair of air gap voids 35a and 35b (which although defined as air gap voids may be filled with an alternative gas or be at least partially vacuum evacuated) adjacent a pair of sidewalls of a pair of capacitor structures as illustrated within the schematic cross-sectional diagram of FIG. 4.

Finally, there is also shown within the schematic cross-sectional diagram of FIG. 4l and formed into the third aperture once lined with the pair of contiguous liner and sidewall plug layers 32a and 32b a bitline stud layer 34.

Within the preferred embodiment of the present invention, the bitline stud layer 34 may be formed employing methods and materials as are conventional in the art of semiconductor integrated circuit fabrication, which will typically and preferably include chemical mechanical polish (CMP) planarizing methods which form the bitline stud layer 34 of conductor materials (including but not limited to metal, metal alloy and doped polysilicon and polycide conductor materials), as well as barrier materials (including but not limited to metal and metal nitride barrier materials). Within the present invention, metal materials (such as tungsten materials), and barrier materials (such as titanium/titanium nitride laminated barrier materials) are particularly preferred for forming the bitline stud layer 34.

As is understood by a person skilled in the art, within the semiconductor integrated circuit fabrication whose schematic cross-sectional diagram is illustrated in FIG. 4: (1) the pair of patterned conformal first capacitor plate layers 24a and 24b, in conjunction with; (2) the pair of patterned capacitor dielectric layers (not shown); and (3) the pair of etched back patterned conformal second capacitor plate layers 26a' and 26b', comprise a pair of capacitor structures, and in particular a pair of stacked container capacitor structures. The pair of capacitor structures provides a pair of sidewalls, in general having an overall height H3 (from bottom of first capacitor plate to top of second capacitor plate as illustrated within the schematic cross-sectional diagram of FIG. 1) of from about 14000 to about 28000 angstroms. As is also illustrated within the schematic cross-sectional diagram of FIG. 4, the bitline stud layer 34 is adjacent to and rises above the pair of sidewalls of the pair of capacitor structures, while being separated therefrom in part by the pair of air gap voids 35a and 35b. In turn, each of the pair of air gap voids 35a and 35b is typically and preferably formed with a horizontal linewidth of from about 300 to about 1000 angstroms and a vertical height of from about 4000 to about 12000 angstroms adjacent a capacitor structure to thus occupy about 40 to about 60 percent of a horizontal distance between the bitline stud layer and a capacitor structure and about 50 to about 80 percent of the height of a capacitor structure.

Upon forming the semiconductor integrated circuit fabrication whose schematic cross-sectional diagram is illustrated in FIG. 4, there is provided within a semiconductor integrated circuit fabrication a dynamic random access memory (DRAM) cell with enhanced performance. The dynamic random access memory (DRAM) memory cell has enhanced performance incident to being formed with an air gap void interposed between: (1) a bitline stud layer; and (2) a capacitor structure adjacent to which is formed and above which rises the bitline stud layer, within the dynamic random access memory (DRAM) cell. The enhanced performance of the dynamic random access memory (DRAM) cell derives from reduced capacitive coupling between the bitline stud layer and both of a pair of capacitor plate layers within the capacitor structure.

As is understood by a person skilled in the art, the preferred embodiment of the present invention is illustrative of the present invention rather than limiting of the present invention. Revisions and modifications may be made to methods, materials, structures and dimensions through which is provided a semiconductor integrated circuit fabrication in accord with the preferred embodiment of the present invention, while still providing a memory cell structure in accord with the present invention, further in accord with the accompanying claims.

What is claimed is:

1. A method for fabricating a memory cell structure comprising:

providing a semiconductor substrate;

forming within and upon the semiconductor substrate a field effect transistor (FET) device comprising a gate dielectric layer formed upon the semiconductor substrate, a gate electrode formed upon the gate dielectric layer and a pair of source/drain regions formed into the semiconductor substrate and separated by the gate electrode;

forming over the field effect transistor (FET) device, and in electrical communication with one of the pair of source/drain regions within the field effect transistor (FET) device, a capacitor structure having a sidewall; and forming over the field effect transistor (FET) device, and in electrical communication with the other of the pair of source/drain regions within the field effect transistor (FET) device, a bitline stud layer adjacent to and extending above the sidewall of the capacitor structure, wherein the bitline stud layer is separated from the sidewall of the capacitor structure at least in part by an air gap void.

2. The method of claim 1 wherein the memory cell structure is a dynamic random access memory (DRAM) memory cell structure.

3. The method of claim 1 wherein the sidewall of the capacitor structure has a height of from about 14000 to about 28000 angstroms.

4. The method of claim 1 wherein the air gap void has a horizontal linewidth of from about 300 to about 1000 angstroms and a vertical height of from about 4000 to about 12000 angstroms.

5. The method of claim 1 wherein the air gap void occupies from about 40 to about 60 percent of a horizontal distance between the bitline stud layer and the sidewall of the capacitor structure.

6. The method of claim 1 wherein the air gap void occupies from about 50 to about 80 percent of a vertical height of the sidewall of the capacitor structure.

7. The method of claim 1 wherein the air gap void is formed through selective etching of a conformal sacrificial layer which is sandwiched upon the capacitor structure.

8. A memory cell structure comprising:

a semiconductor substrate;

a field effect transistor (FET) device formed within and upon the semiconductor substrate, the field effect transistor (FET) device comprising a gate dielectric layer formed upon the semiconductor substrate, a gate electrode formed upon the gate dielectric layer and a pair of source/drain regions formed into the semiconductor substrate and separated by the gate electrode;

a capacitor structure formed over the field effect transistor (FET) device and in electrical communication with one of the pair of source/drain regions within the field effect transistor (FET) device, the capacitor structure having a sidewall; and a bitline stud layer formed over the field effect transistor (FET) device and in electrical communication with the other of the pair of source/drain regions within the field effect transistor (FET) device, the bitline stud layer being adjacent to and extending above the sidewall of the capacitor structure, wherein the bitline stud layer is separated from the sidewall of the capacitor structure at least in part by an air gap void.

9. The memory cell structure of claim 8 wherein the memory cell structure is a dynamic random access memory (DRAM) memory cell structure.

10. The memory cell structure of claim 8 wherein the sidewall of the capacitor structure has a vertical height of from about 12000 to about 26000 angstroms.

11. The memory cell structure of claim 8 wherein the air gap void has a horizontal linewidth of from about 300 to about 1000 angstroms and a vertical height of from about 4000 to about 12000 angstroms.

12. The memory cell structure of claim 8 wherein the air gap void occupies from about 40 to about 60 percent of a horizontal distance between the bitline stud layer and the sidewall of the capacitor structure.

13. The memory cell structure of claim 8 wherein the air gap void occupies from about 50 to about 80 percent of a vertical height of the capacitor structure.

* * * * *